(12) United States Patent
Campini et al.

(10) Patent No.: US 7,714,433 B2
(45) Date of Patent: May 11, 2010

(54) PIEZOELECTRIC COOLING OF A SEMICONDUCTOR PACKAGE

(75) Inventors: Edoardo Campini, Mesa, AZ (US);
Javier Leija, Chandler, AZ (US);
William Handley, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 450 days.

(21) Appl. No.: 11/716,246

(22) Filed: Mar. 9, 2007

(65) Prior Publication Data

US 2008/0217764 A1 Sep. 11, 2008

(51) Int. Cl.
*H01L 23/34* (2006.01)
(52) U.S. Cl. .................. 257/722; 257/712; 257/713; 257/715; 257/721; 257/730; 257/E23.138; 257/E23.139; 257/E33.075; 257/E31.131
(58) Field of Classification Search .............. 257/687, 257/E23.138, E23.139, 276, 625, 675, 706, 257/707, 712–722, 796, E33.075, E31.131, 257/E23.08–E23.113
See application file for complete search history.

(56) References Cited

U.S. PATENT DOCUMENTS

| | | | | | |
|---|---|---|---|---|---|
| 5,838,066 | A | * | 11/1998 | Kitajo | ........................ 257/722 |
| 6,019,165 | A | * | 2/2000 | Batchelder | ................. 165/80.3 |
| 6,498,395 | B2 | * | 12/2002 | Baek et al. | ................... 257/722 |
| 2006/0138905 | A1 | | 6/2006 | Gonzales et al. | ............ 310/331 |
| 2008/0218972 | A1 | | 9/2008 | Sauciuc et al. | |
| 2008/0238256 | A1 | | 10/2008 | Leija et al. | |
| 2009/0034197 | A1 | | 2/2009 | Leija et al. | |

FOREIGN PATENT DOCUMENTS

JP        4-65863       * 3/1992        ................. 257/712

* cited by examiner

*Primary Examiner*—Jasmine J Clark
(74) *Attorney, Agent, or Firm*—Trop, Pruner & Hu, P.C.

(57) ABSTRACT

In one embodiment, the present invention includes a semiconductor package having a plurality of fan blades embedded within a first surface of the package, where a first group of the fan blades extend from a first side of the package and a second group of the fan blades extend from a second side of semiconductor package. The fan blades may be powered by piezoelectric devices to cause motion of the fan blades. Other embodiments are described and claimed.

19 Claims, 4 Drawing Sheets

PIEZOELECTRIC COOLING OF A SEMICONDUCTOR PACKAGE

BACKGROUND

In today's electronic systems, heat dissipation can adversely affect performance. Cooling difficulties may be particularly experienced in dense form factors and bladed architectures such as Advanced Telecom Computing Architecture (ATCA), Advanced Mezzanine Card (AMC), and Micro-ATCA (uATCA) implementations of blade and other types of servers and similar equipment. Cooling multiple AMC modules in ATCA configurations can be extremely problematic due to the ventilation blocking effect one AMC module presents to another.

Integrated circuits and other electronic devices generate heat as they operate, and their performance and reliability may decrease as their temperature rises. For example, an integrated circuit might operate more slowly or become damaged when it becomes too hot. To reduce this effect, a motorized fan heatsink (e.g., a blower) or liquid cooling system may be provided to lower the integrated circuit's temperature. In either case, the moving parts associated with the cooling system may fail. In addition, the location of the integrated circuit and surrounding components might make such solutions impractical. Moreover, the sound and/or electromagnetic noise produced by these cooling systems may be undesirable.

DETAILED DESCRIPTION

In various embodiments, an embedded piezoelectric fan within a semiconductor device itself may provide a reliable, long life, low cost, efficient, quiet, low vibration, low profile, thermal solution. As an example, the semiconductor device may be a package including one or more dies. Alternately, the device may be a die to be mounted on a circuit board or other substrate. Multiple piezoelectric fan blades may be adapted on or within an electronic device to create a desired airflow pattern for cooling the device.

Figure 1:
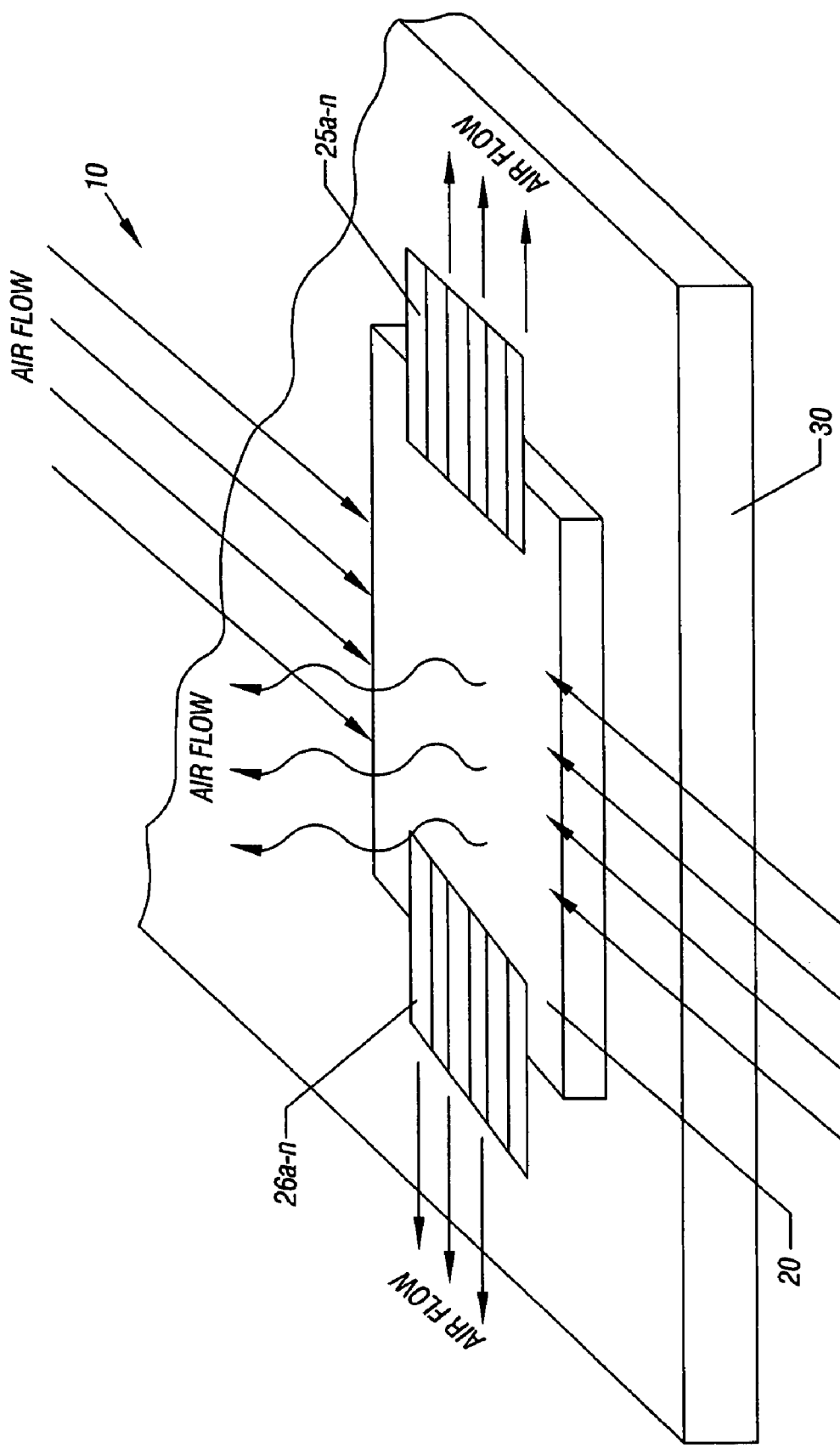
FIG. 1 is a plan view of a semiconductor package in accordance with one embodiment.

Referring now to FIG. 1, shown is a plan view of a portion of a system 10 in accordance with one embodiment. As shown in FIG. 1, a package with multiple embedded piezoelectric blades on opposite sides of the package is mounted on a circuit board. As shown in FIG. 1, package 20, which may be a package of a processor such as a multi-core processor, network processor or any other type of semiconductor device such as a chipset, memory and so forth, may be affixed to circuit board 30. Adapted on a first side of package 20 is a first plurality of piezoelectric fan blades 25*a-n* (generically fan blade 25) and on a second side of package 20 a second plurality of piezoelectric fan blades 26*a-n* are provided. While the scope of the present invention is not so limited, in some embodiments, fan blades may be between approximately 1 and 5 inches long. In the embodiment of FIG. 1, fan blades 25 may thus be horizontally mounted on package 20, which in turn is mounted on a horizontal board 30. The resultant airflow is shown coming in from the front and rear of package 20, and leaving from the left, right, and top of package 20.

When an external voltage is applied to the piezoelectric material associated with a fan blade 25, the piezoelectric material will deform, causing fan blade 25 to move in one direction (up or down). When the external voltage is removed from the piezoelectric material it will return to its original dimension, causing fan blade 25 to move in the opposite direction. When an electric current flows through a piezoelectric portion associated with a fan blade 25 in one direction, the piezoelectric portion may deform, causing fan blade 25 to flex upward. Similarly, when an electrical current flows through the piezoelectric portion in the opposite direction, the piezoelectric portion may return to its original shape, causing fan blade 20 to flex downward. Thus, when an alternating (or pulsating) voltage is applied to the piezoelectric portion associated with fan blade 25, it will oscillate (or vibrate) at an appropriate frequency. The piezo electric blades also operate within the infra sonic audible range, thus operation does not create a noise audible by the human ear. This allows the electronic package to be cooled with a silent air movement device.

Figure 2:
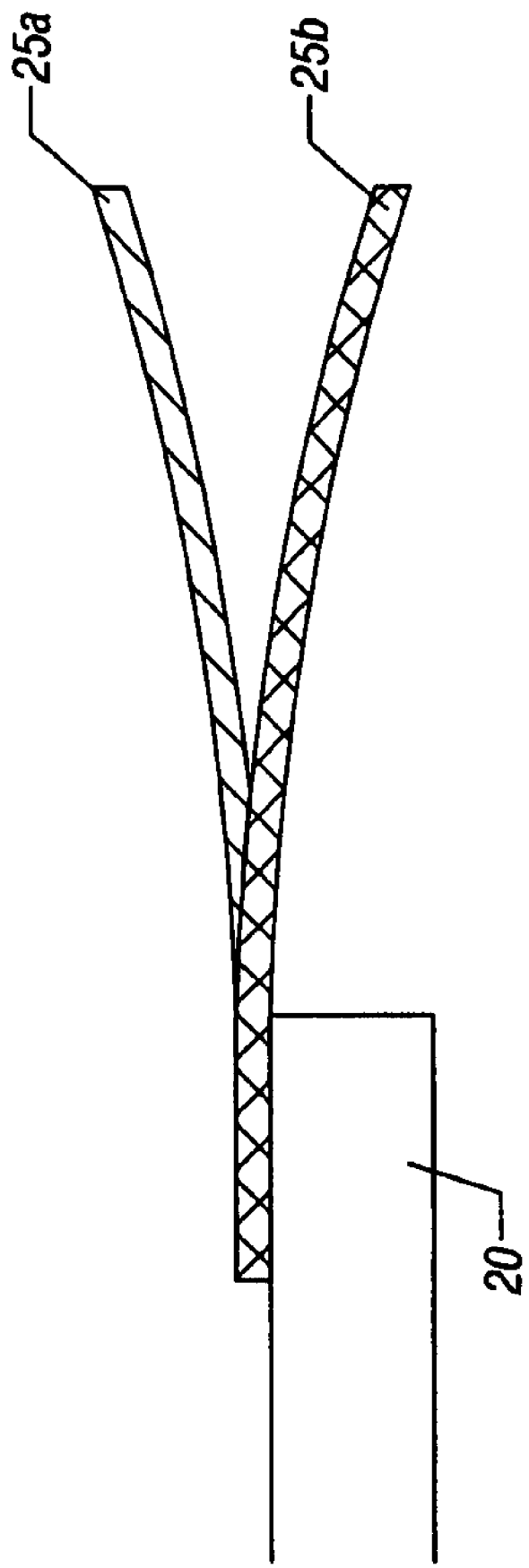
FIG. 2 is a side view of the semiconductor package of the embodiment of FIG. 1.

Thus in the embodiment of FIG. 1, two sides of package 20 include multiple embedded piezoelectric fan blades 25. In order to cancel out forces from the vibrating blades, half the blades may vibrate in phase with one another, while the other half of the blades vibrate using a 180 degree phase shift. Therefore, each fan blade vibrates 180 degrees out of phase from the blade on either side. FIG. 2 represents a close-up, front view of package 20, illustrating the out of phase relationship between adjacent blades. As shown in FIG. 2, a first fan blade 25*a* is vibrated 180 degrees out of phase with a second, adjacent fan blade 25*b*. However, other methods of controlling actuation of fan blades may occur in other embodiments, such as varying amounts of phase difference.

Thus in various embodiments, embedded piezoelectric fan blades within a package may provide airflow for cooling. Further, these blades may be powered such that each adjacent piezoelectric fan blade is powered with a phase shifted power source from, e.g., within package 20, or from an external source such as a power supply of a circuit board. Powering half the blades from a power source that is, e.g., 180 degrees out of phase from the remaining blades may thus result in a canceling effect for vibration, which can benefit low noise and high reliability applications. Although not limited in this regard, in some embodiments positive and negative portions of a power supply output may be coupled to the blades in alternating fashion such that each adjacent blade receives out of phase power.

In different embodiments, fan blades can be mounted on two or more sides, either horizontally to a package (as shown in FIG. 1) or perpendicularly, dependent on the application requirements. For example, due to the natural airflow caused by convection in a blade computer architecture application (i.e., from bottom to top), placing embedded fan blades on only two sides (horizontally to the package, and perpendicular to chassis ventilation) may result in optimal airflow.

Figure 3:
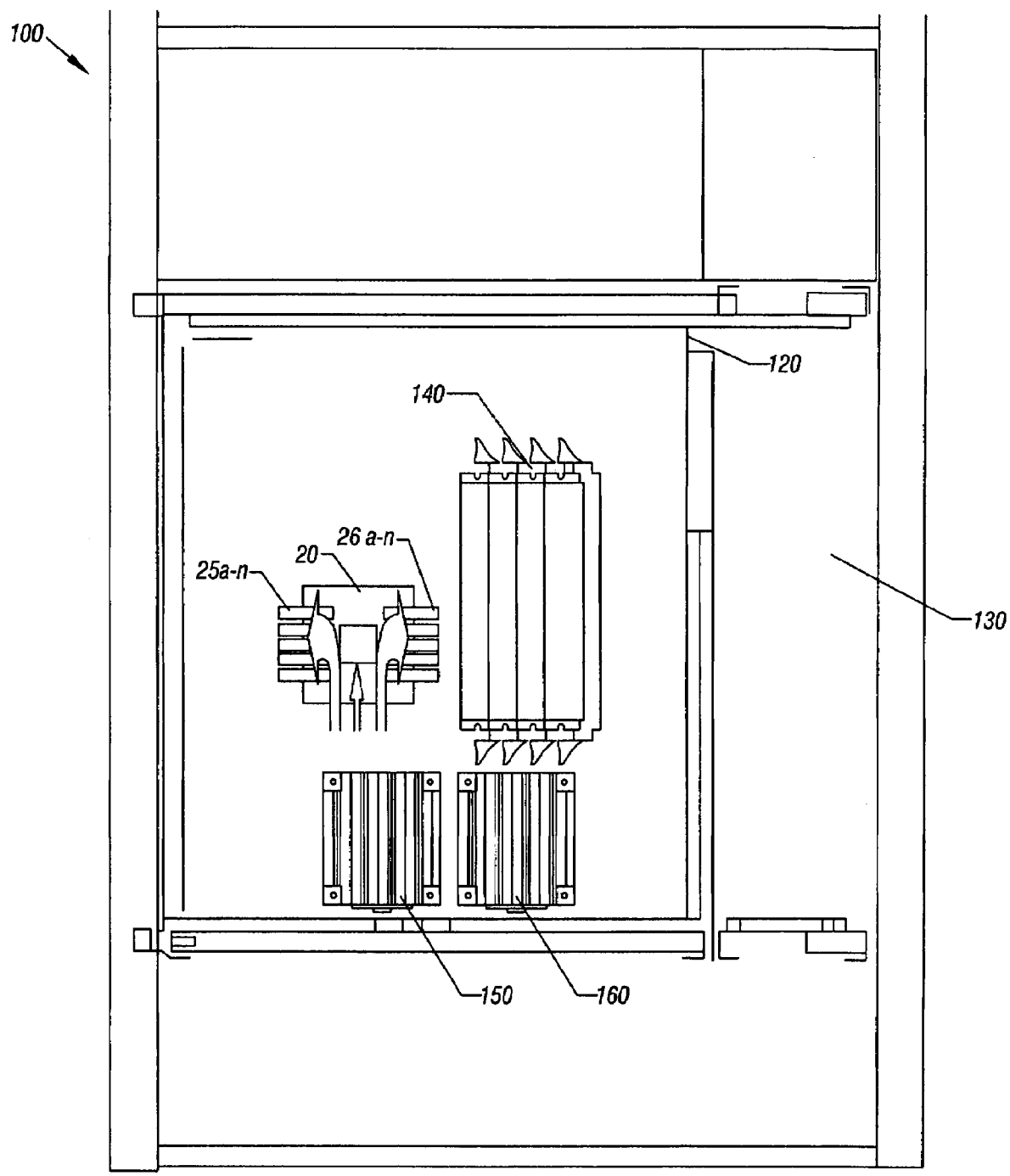
FIG. 3 is a side view of a system in accordance with an embodiment of the present invention.

FIG. 3 is a graphical illustration of an embodiment of the present invention incorporated in a blade computer architecture application. Specifically, FIG. 3 shows a blade server 100 from an exposed side view in which a circuit board 120 includes a semiconductor package 20 having multiple piezoelectric fan blades 25*a-n* and 26*a-n* within the package, as shown horizontally disposed on a top-surface of the package, which is in turn mounted to circuit board 120. Circuit board 120 is coupled to a backplane 130. Of course other components may be present on circuit board 120 including, for example, processors 150 and 160 and a plurality of memory modules 140 among other such components. This location and configuration thus may improve airflow of hot air rising from processors 150 and 160, as fan blades 25a-n and 26a-n vibrate horizontally to cause the air flow shown in FIG. 3. Such a blade server 100 may include many such circuit boards vertically configured parallel to each other in one or more racks of the chassis.

Figure 4:
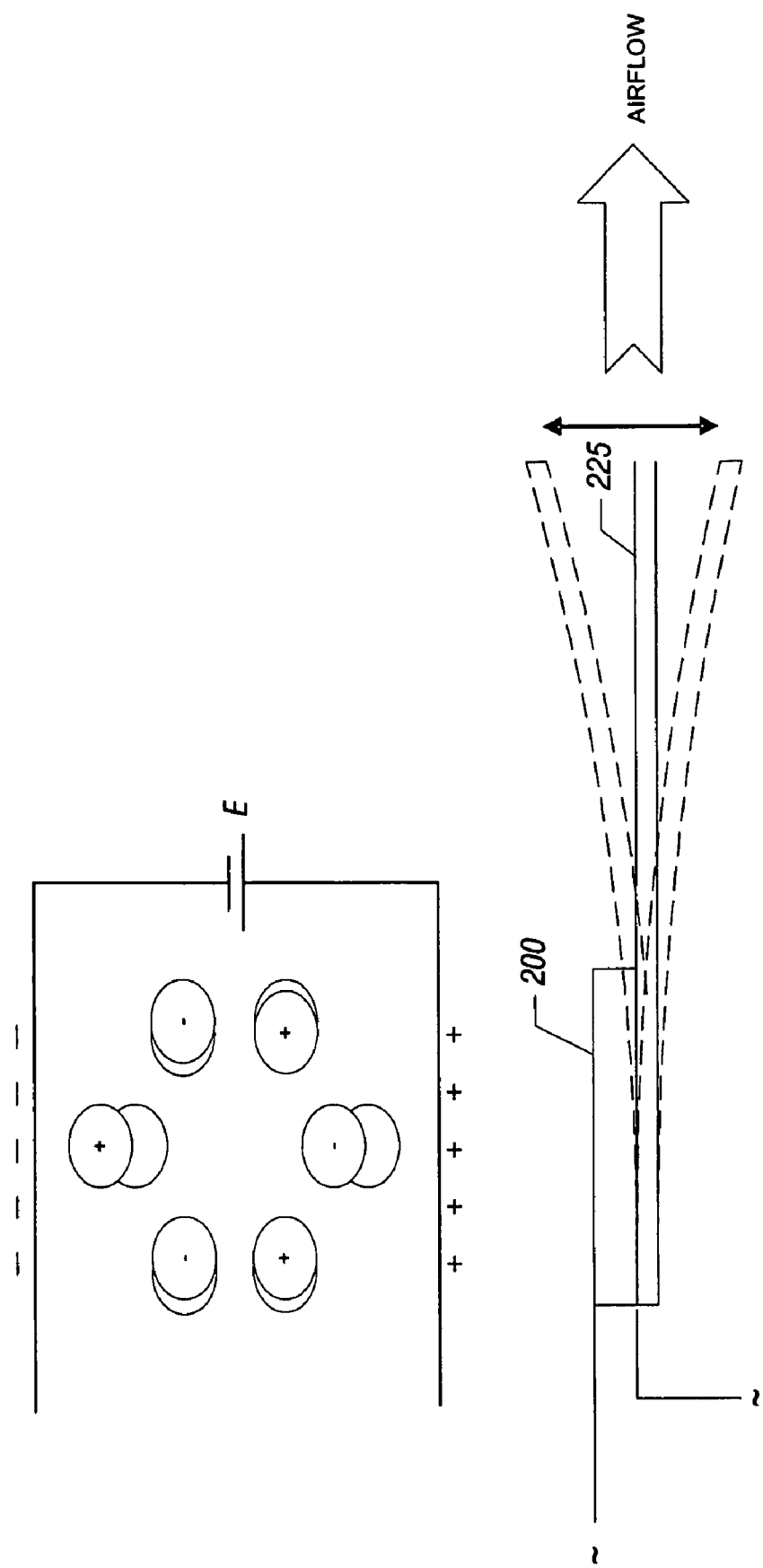
FIG. 4 is a schematic diagram of a piezoelectric device in accordance with an embodiment of the present invention.

FIG. 4 illustrates a piezoelectric element in accordance with one embodiment. As shown in FIG. 4, a piezo element 200 may be controlled with a power source to generate an electric field, E, which causes dimensions of piezo element 200 to change in response to this electric field. In so doing, blade 225 vibrates up and down (in the configuration of FIG. 4) to generate a desired air flow. In one embodiment, piezoelectric element 200 may be a piezoelectric patch having blade 225 attached thereto. When an alternating voltage is applied to the piezoelectric patch, the patch will oscillate. Since the piezoelectric patch/fan blade is fixed at one end, the opposite end will vibrate. The oscillating deflection at the free end will create an airflow pattern.

Thus using various embodiments, a lower cost fan solution may be provided, with a small form factor fan, having improved efficiency, low acoustic noise, low vibration, high reliability/life, and no maintenance.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An apparatus comprising:
   a semiconductor device including at least one semiconductor die;
   a plurality of fan blades adapted to a first surface of the semiconductor device, wherein a first group of the plurality of fan blades extend from a first side of the semiconductor device and a second group of the plurality of fan blades extend from a second side of the semiconductor device; and
   a plurality of piezoelectric devices each coupled to one of the plurality of fan blades to cause vibration thereof.

2. The apparatus of claim 1, wherein the plurality of piezoelectric devices each comprises a piezoelectric patch to deform when a voltage is applied across the piezoelectric patch and to return to an original shape when the voltage is removed.

3. The apparatus of claim 2, wherein each fan blade of the plurality of fan blades is to vibrate out of phase with two fan blades adjacent thereto.

4. The apparatus of claim 3, further comprising a phase shifted power source to power the plurality of fan blades.

5. The apparatus of claim 4, wherein the plurality of fan blades are controlled to cause incoming airflow from at least a third side of the semiconductor device substantially perpendicular to the first and second sides, and cause outgoing airflow from the first and second sides and the first surface of the semiconductor device.

6. The apparatus of claim 1, wherein the semiconductor device is mounted on a horizontal circuit board and the plurality of fan blades are embedded within a horizontal surface of the semiconductor device.

7. The apparatus of claim 6, wherein the plurality of fan blades are to vibrate in a substantially vertical orientation.

8. A system comprising:
   a plurality of circuit boards coupled to a backplane, the plurality of circuit boards in a first orientation; and
   a first semiconductor device coupled to one of the plurality of circuit boards, the first semiconductor device having a plurality of fan blades coupled thereto to vibrate in a second orientation, the second orientation substantially perpendicular to the first orientation, wherein each fan blade of the plurality of fan blades is to vibrate out of phase with two fan blades adjacent thereto.

9. The system of claim 8, wherein a first group of the plurality of fan blades extend from a first side of the first semiconductor device and a second group of the fan blades extend from a second side of the first semiconductor device.

10. The system of claim 9, further comprising a plurality of piezoelectric devices each coupled to one of the plurality of fan blades, each of the plurality of piezoelectric devices comprising a piezoelectric patch to deform when provided with a voltage.

11. The system of claim 8, further comprising a phase shifted power source to power the plurality of fan blades.

12. The system of claim 9, wherein the first semiconductor device is located on the circuit board above at least one processor, and wherein the plurality of fan blades are to dissipate at least some heat generated by the at least one processor.

13. The system of claim 12, wherein the plurality of fan blades are controlled to cause incoming airflow from the direction of the at least one processor to become outgoing airflow from the first and second sides and the first surface of the first semiconductor device.

14. The system of claim 12, wherein the system comprises a blade system.

15. An apparatus comprising:
   a semiconductor package including at least one semiconductor die; and
   a plurality of fan blades adapted to a first surface of the semiconductor package, wherein a first group of the plurality of fan blades extend from a first side of the semiconductor package and a second group of the plurality of fan blades extend from a second side of the semiconductor package, each of the plurality of fan blades having a piezoelectric material associated therewith to cause vibration when provided with a voltage.

16. The apparatus of claim 15, wherein the piezoelectric material comprises a piezoelectric patch to deform when the voltage is applied across the piezoelectric patch and to return to an original shape when the voltage is removed.

17. The apparatus of claim 16, wherein each fan blade of the plurality of fan blades is to vibrate out of phase with two fan blades adjacent thereto.

18. The apparatus of claim 17, wherein the semiconductor package includes a multi-core processor.

19. The apparatus of claim 18, wherein the semiconductor package includes a phase shifted power source coupled to the piezoelectric material.

* * * * *